(12) United States Patent
Zang et al.

(10) Patent No.: US 9,496,280 B1
(45) Date of Patent: Nov. 15, 2016

(54) SEMICONDUCTOR STRUCTURE HAVING LOGIC REGION AND ANALOG REGION

(71) Applicant: GLOBALFOUNDRIES Inc., Grand Cayman (KY)

(72) Inventors: Hui Zang, Guilderland, NY (US); Bingwu Liu, Ballston Spa, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/700,748

(22) Filed: Apr. 30, 2015

(51) Int. Cl.
| | | |
|---|---|---|
| *H01L 21/76* | (2006.01) | |
| *H01L 27/12* | (2006.01) | |
| *H01L 21/84* | (2006.01) | |
| *H01L 29/66* | (2006.01) | |
| *H01L 21/02* | (2006.01) | |
| *H01L 29/78* | (2006.01) | |
| *H01L 29/73* | (2006.01) | |
| *H01L 29/08* | (2006.01) | |
| *H01L 29/06* | (2006.01) | |

(52) U.S. Cl.
CPC ..... *H01L 27/1203* (2013.01); *H01L 21/02639* (2013.01); *H01L 21/84* (2013.01); *H01L 29/0684* (2013.01); *H01L 29/0847* (2013.01); *H01L 29/66234* (2013.01); *H01L 29/66568* (2013.01); *H01L 29/73* (2013.01); *H01L 29/78* (2013.01)

(58) Field of Classification Search
CPC ............... H01L 21/76224; H01L 21/76264; H01L 21/763; H01L 21/76229; H01L 21/76232
USPC ........................................................ 257/506
See application file for complete search history.

(56) References Cited

U.S. PATENT DOCUMENTS 7,148,543 B2 * 12/2006 Yamada ............ H01L 21/76264
257/1

* cited by examiner

*Primary Examiner* — Monica D Harrison
(74) *Attorney, Agent, or Firm* — Heslin Rothenberg Farley and Mesiti PC; Nicholas Mesiti (57) ABSTRACT

A method can include epitaxially growing epitaxial growth material within a logic region of a semiconductor structure. A method can include performing simultaneously with the growing epitaxial growth within an analog region of the semiconductor structure. A method can include performing epitaxial growth to form an epitaxial growth formation that defines an electrode of an analog device within an analog region of the semiconductor structure, wherein the performing includes using a first surface and a second surface as seed surfaces.

20 Claims, 13 Drawing Sheets

SEMICONDUCTOR STRUCTURE HAVING LOGIC REGION AND ANALOG REGION

TECHNICAL FIELD

The present disclosure relates to a semiconductor structure and more particularly a semiconductor structure having a logic region and an analog region.

BACKGROUND OF THE INVENTION

A semiconductors structure can be fabricated using a silicon on insulator (SOI) structure. A SOI structure can include a silicon substrate, an insulator and a thin (e.g. less than 100 nm) layer of silicon. A semiconductor structure can include a logic region and an analog region. A logic region can include one or more logic devices and an analog region can include one or more analog devices. In one example, a logic region can include one or more metal-oxide-semiconductor (having any conductor insulator and semiconductor) field effect transistor (MOSFET) and an analog region can include one or more bipolar device. Such MOSFETs can have channels that are defined within the thin silicon layer. A bipolar device can include e.g. an np junction, a pn junction, a bipolar junction transistor (BJT). An electrode of such a bipolar device can be defined within the substrate.

BRIEF DESCRIPTION

A method can include epitaxially growing epitaxial growth material within a logic region of a semiconductor structure. A method can include performing simultaneously with the growing epitaxial growth within an analog region of the semiconductor structure. A method can include performing epitaxial growth to form an epitaxial growth formation that defines an electrode of an analog device within an analog region of the semiconductor structure, wherein the performing includes using a first surface and a second surface as seed surfaces.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
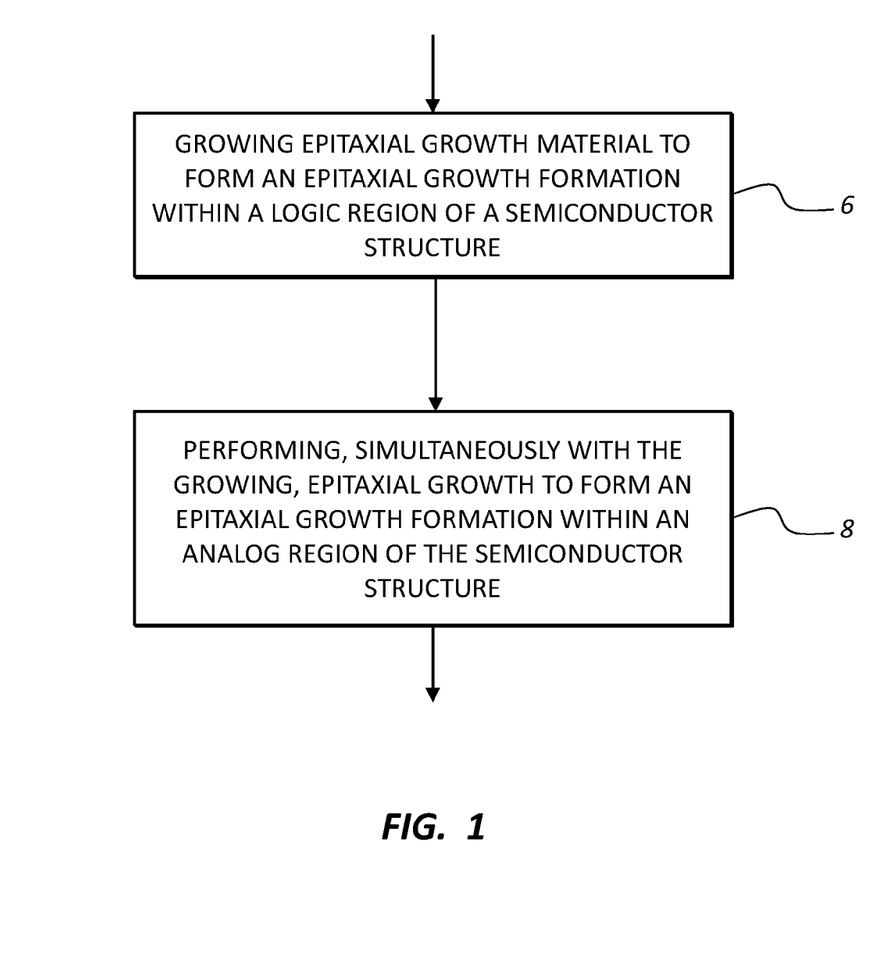
FIG. 1 is a flow diagram illustrating a method for fabricating a semiconductor structure.

According to a method, an epitaxial growth material can be simultaneously grown within a logic region and an analog region of a semiconductor structure. Referring to the flow drawing of FIG. 1 a method can include at block 6 epitaxially growing epitaxial growth material within a logic region of a semiconductor structure. A method can include performing at block 8, simultaneously with the growing, epitaxial growth within an analog region of the semiconductor structure.

Figure 2:
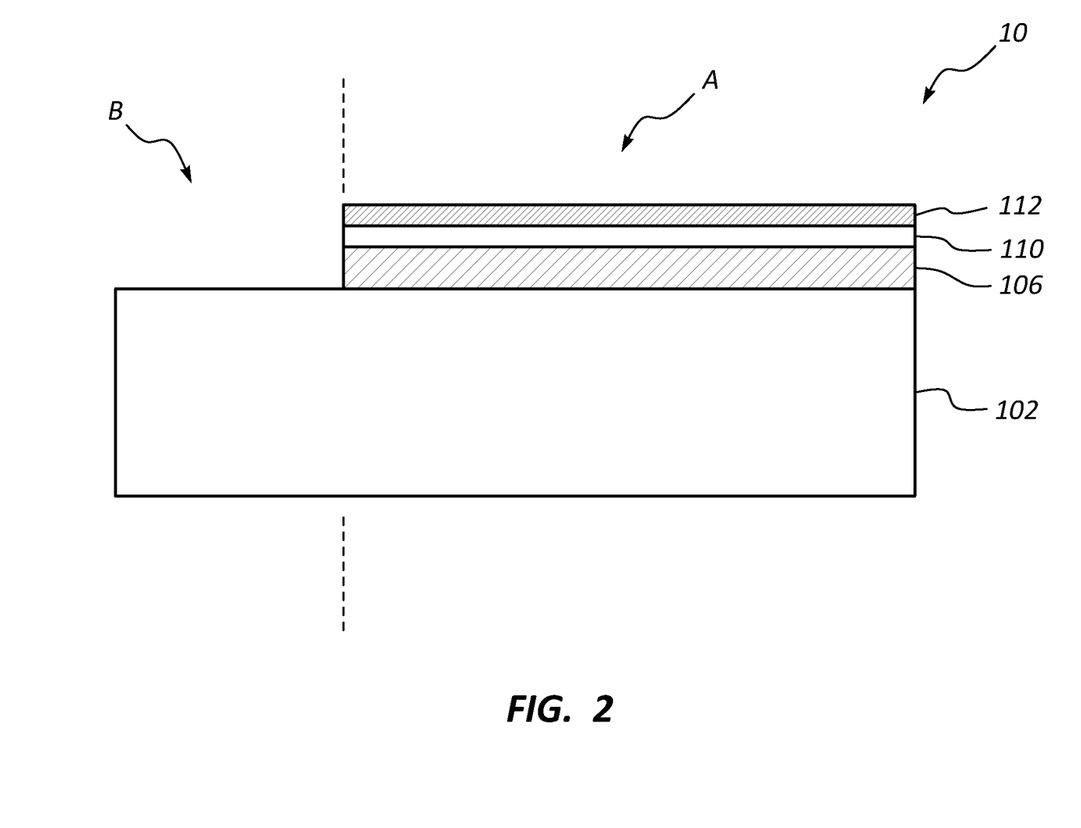
FIG. 2 is a cutaway side view of a semiconductor structure in an intermediary fabrication stage having an logic region and an analog region.

In reference to FIG. 2 there is shown a semiconductor structure 10 having a substrate 102, layer 106, layer 110, and layer 112. Substrate 102 in one embodiment can be formed of silicon. Layer 106 in one embodiment can be formed of dielectric material, e.g. oxide. Layer 110 in one embodiment can be formed of silicon and layer 112 can be formed of dielectric material, e.g. high K material. Layer 110 in one embodiment can be a thin silicon layer having a thickness in the range of e.g. 1 nm to about 100 nm. Layer 112 can be a pad oxide layer.

In one embodiment, semiconductor structure 10 can have a first region A and a second region B. First region A can be a logic region and can include logic and/or memory (e.g. SRAM, Flash, DRAM) metal oxide semiconductor field effect transistors (MOSFETs). Region B can be an analog region and can include, e.g., power or other analog bipolar devices, e.g., diodes (np or pn junctions). In one example, a logic region A can include one or more metal-oxide-semiconductor (having any conductor insulator and semiconductor) field effect transistor (MOSFET) and an analog region B can include one or more bipolar device. For formation of devices at analog region B, in one embodiment, a mask can be applied over region A and material from layer 106, layer 110, and layer 112 can be removed from region B. An epitaxial growth formation (not shown) can then be epitaxially grown on Region B on a top surface of substrate 102 so that a top elevation of the epitaxial growth formation substantially corresponds to a top elevation of layer 110. Accordingly, the substantially common elevation of layer 110 and the formation can facilitate further fabrication of logic and/or memory MOSFETs within logic region A and analog devices, e.g. bipolar devices within analog region B.

It can be particularly advantageous for contact layer formation that contact layers be formed at a substantially common elevation. It was observed that a process for epitaxially growing a formation within region B to obtain an elevation substantially in common with an elevation of layer 110 can be costly. A reduced cost method for formation of logic and/or memory MOSFETs within logic region A and an analog device within an analog region B is set forth in one example with reference to FIGS. 3-13.

Figure 3:
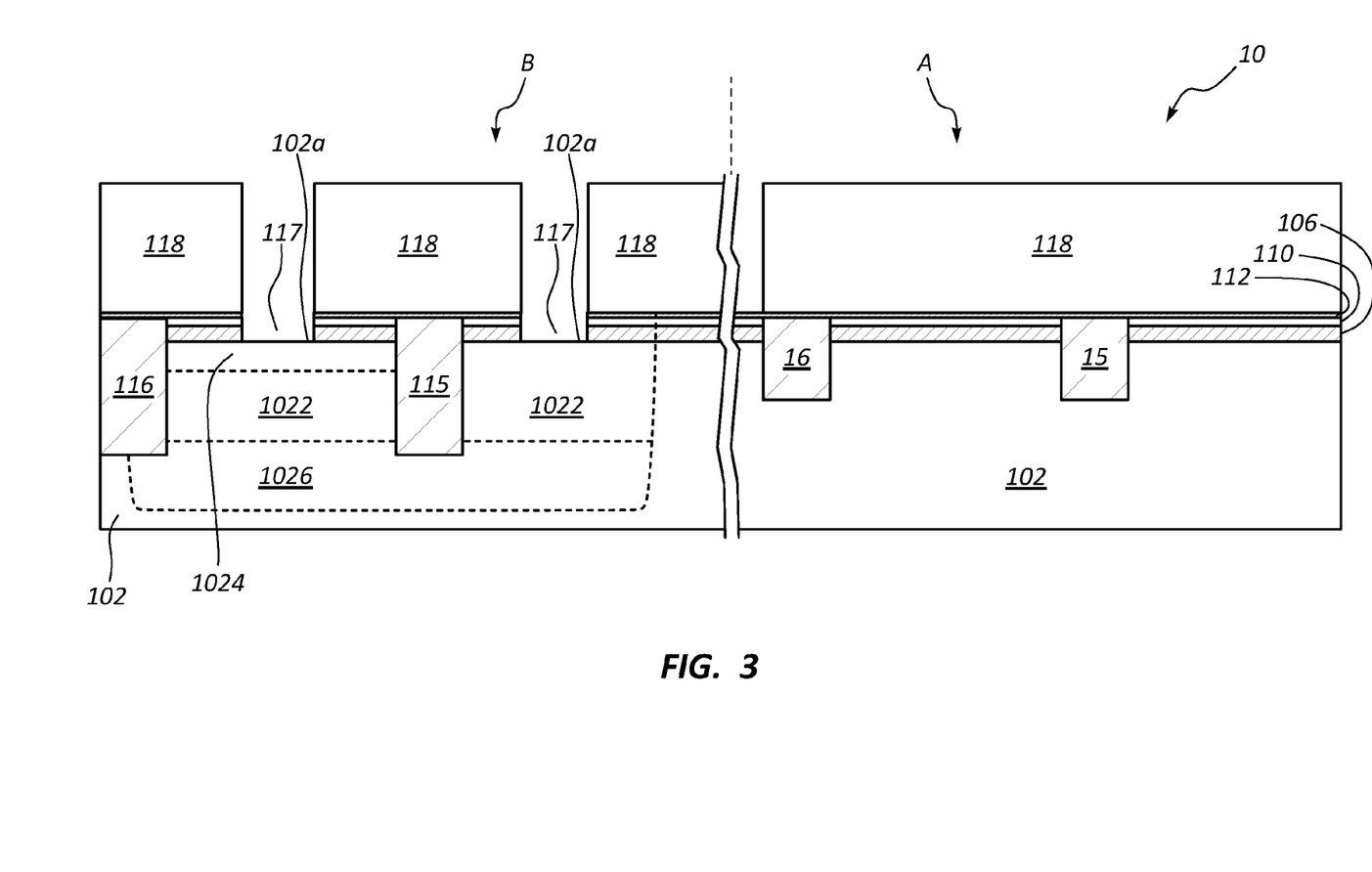
FIG. 3 is a cutaway side view of a semiconductor structure in an intermediary fabrication stage having formed holes to expose a substrate surface.

Referring to FIG. 3, FIG. 3 illustrates a semiconductor structure 10 having substantially the configuration as shown in FIG. 2 after formation of shallow trench isolation formation 15 and shallow trench isolation formation 16 within an analog region B, and after formation of deep trench isolation formation 115 and deep trench isolation formation 116 within an analog region B. Substrate 102 layer 106 and layer 110 and layer 112 can be formed as described in connection with FIG. 2 and can have the same material construction as described in connection with FIG. 2. Substrate 102 layer 106 and layer 110 can be provided by a silicon on insulator (SOI) structure (e.g. a prefabricated SOI wafer) in one embodiment. Further referring to semiconductor structure 10 as shown in FIG. 3, semiconductor structure 10 can include layer 118 formed on layer 112. Layer 118 can be a mask layer. In one embodiment, layer 118 can be formed of photoresist material. First region A as shown in FIG. 3 can be a logic region and can include one or more active logic device, e.g., logic and/or memory (e.g. SRAM, Flash, DRAM) metal oxide semiconductor field effect transistors (MOSFETs). Region B can be an analog region and can include one or more analog device, e.g., one or more power or other analog bipolar device, e.g., one or more diode (np or pn junction) and/or one or more bipolar junction transfer (BJT). In one example, a logic region A can include one or more metal-oxide-semiconductor (having any conductor insulator and semiconductor) field effect transistor (MOSFET) and an analog region B can include one or more bipolar device.

Substrate 102 which can be a silicon substrate can have various sections, e.g., p well section 1022, n+ section 1024, and deep n well section 1026. In an alternative embodiment, section 1022 can be an n well section, section 1024 can be a p+ section and section 1026 can be a deep p well section using mask layer 118. Layer 112, layer 110, and layer 106 can be patterned for formation of holes 117. Holes 117 can expose the surface of substrate 102. Substrate 102 can define a seed surface, e.g. surface 102a (also labeled in FIG. 8) as set forth herein for formation of an epitaxial growth formation within region B. Semiconductor structure 10 as shown in FIG. 3 can include a logic region A Substrate 102 can be regarded as a substrate layer.

Figure 4:
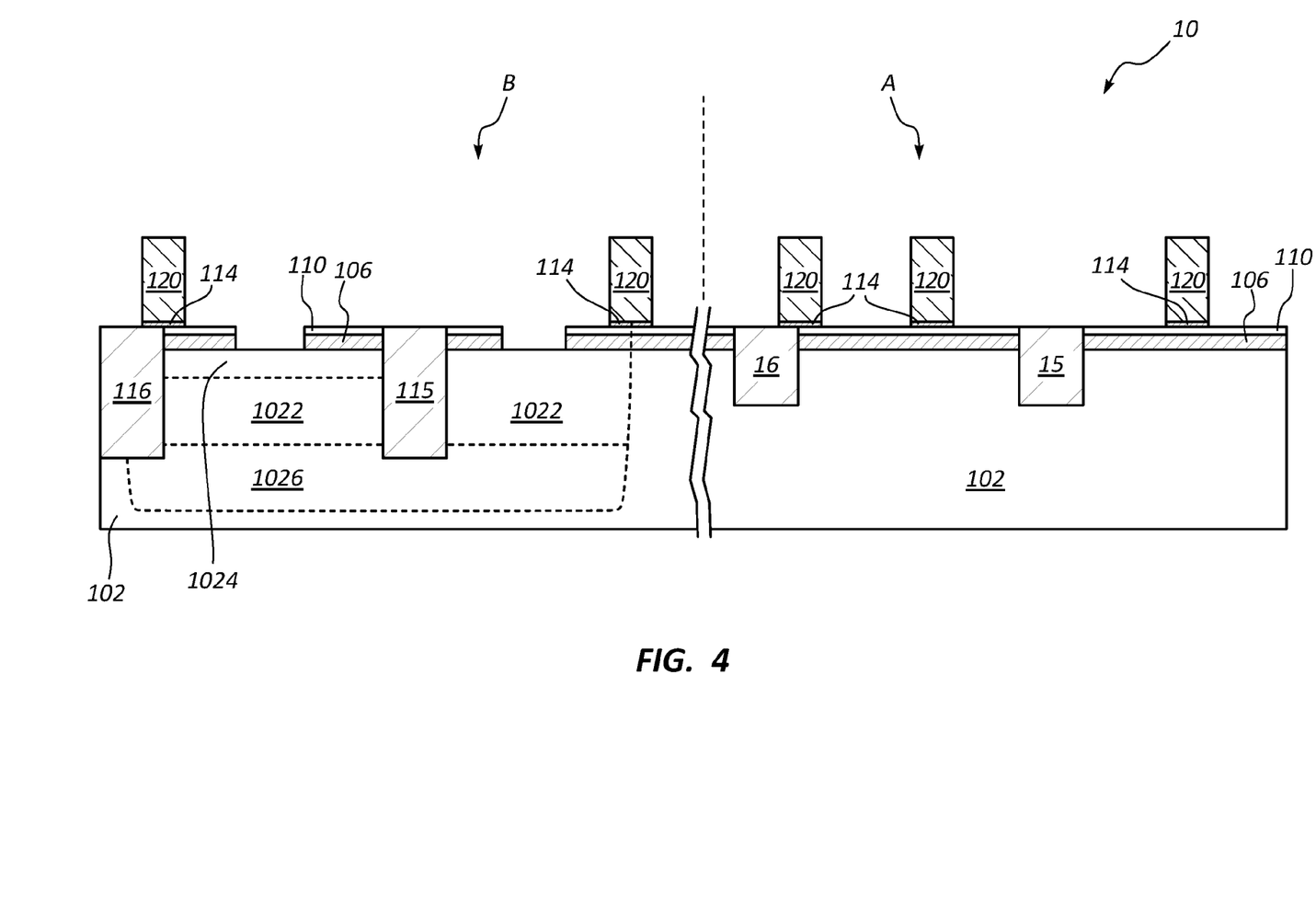
FIG. 4 is a cutaway side view of a semiconductor structure in an intermediary fabrication stage after formation of gate structures.

FIG. 4 illustrates the semiconductor structure 10 as shown in FIG. 3 after removal of material of layer 118 and after formation of gate structures 120. Gate structures can be formed on patterned layer 114 which patterned layer 114 can be formed on layer 110. Layer 114 can be formed of dielectric material, e.g. a high k dielectric material. Gate structures 120 in one embodiment can be sacrificial gate structures and one embodiment can be non-sacrificial gate structures. Gate structures 120 within analog region B can define dummy gates and within logic region A gate structures can define active device gates or dummy gates. Dummy gates which do not provide a MOSFET gating function can be useful for fabrication of devices of semiconductor structure 10. Dummy gates can be useful, e.g., for providing vertical and horizontal spacing of structural features within semiconductor structure 10.

Figure 5:
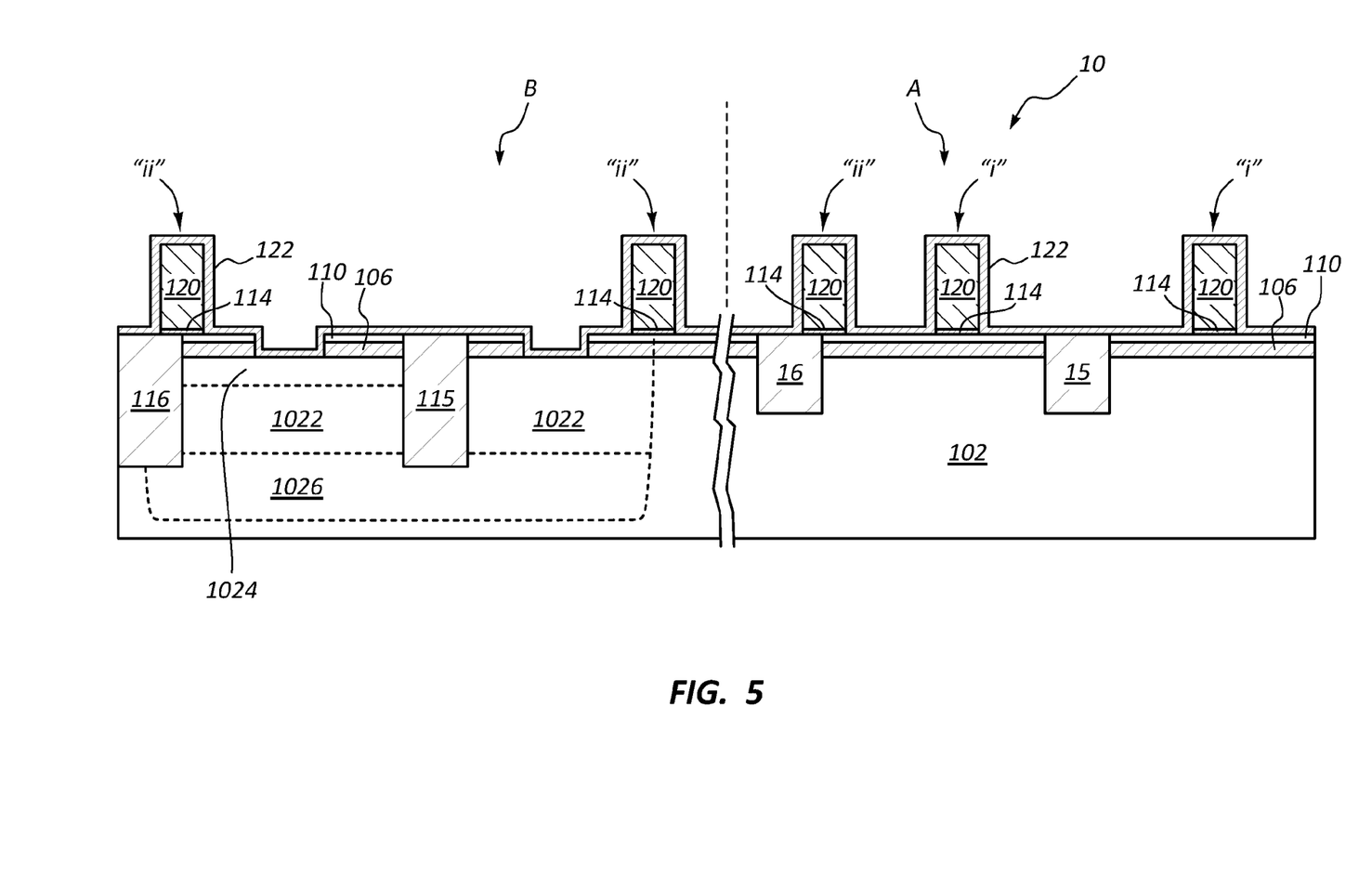
FIG. 5 is a cutaway side view of a semiconductor structure in an intermediary fabrication stage after formation of a dielectric layer.
Figure 6:
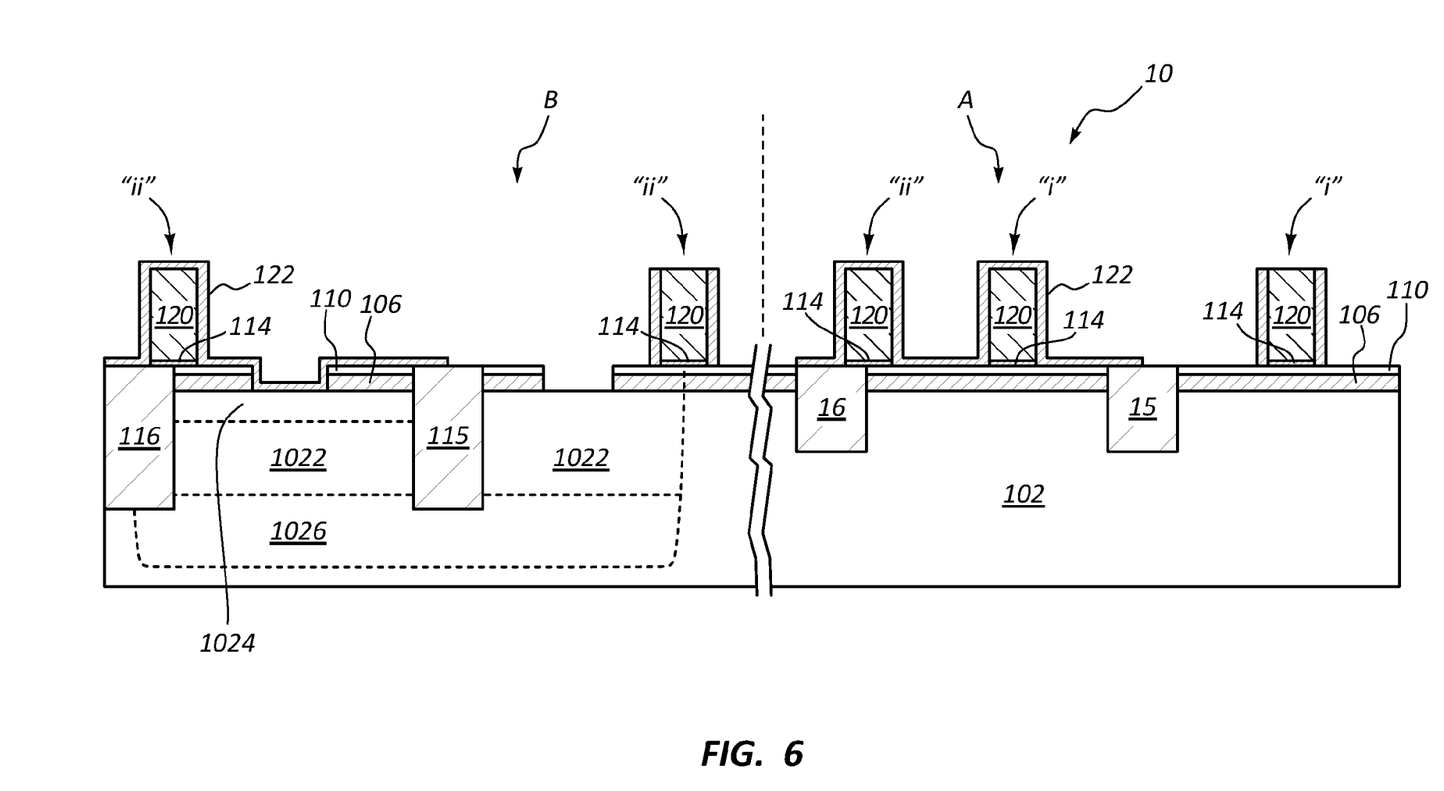
FIG. 6 is a cutaway side view of a semiconductor structure in an intermediary fabrication stage after removal of material at a dielectric layer to define spacers and expose areas of a surface for facilitation of epitaxial growth.

FIG. 5 illustrates a logic region A and an analog region B of the semiconductor structure 10 as shown in FIG. 4. Layer 122 can be a dielectric material layer and can define sidewalls of gate structures 120. Gate structures at locations "i" can be active MOSFET gate structures. Gate structures at locations "ii" can be dummy gate structures. FIG. 6 illustrates the semiconductor structure 10 as shown in FIG. 5 after removal of sections of material of layer 122 from logic region A and analog region B. Within logic region A removal of material of layer 122 can expose a surface of layer 110 which can be a thin silicon layer. Within analog region B removal of material of layer 122 can expose a surface of layer 122 and a surface of substrate 102. Layer 110 and substrate 102 can be formed of silicon. Logic region A can include shallow trench isolation formations 15 and 16. Shallow trench isolation formations 15 and 16 of region A like deep trench isolation formation 115 and 116 of region B can be formed of dielectric material, e.g., oxide. Shallow trench isolation formations 15 and 16 within logic region A can have a shallower depth than deep trench isolation formations 115 and 116 within analog region B.

Referring to semiconductor structure 10 as set forth in FIG. 6 there is set forth a semiconductor structure including a substrate 102 and a dielectric layer 106 formed on the substrate 102. There is also set forth in reference to FIG. 6 a layer 110 formed on the dielectric layer 106, wherein each of the substrate 102, the dielectric layer 106 and the layer 110 extend between a logic region A and an analog region B, wherein within the logic region A a surface 110a (labeled in FIG. 8) of the layer 110 is exposed to serve as an epitaxial growth seed surface, and wherein within the analog region B a surface (one or more of surface 110a 110b or 110c shown labeled in FIG. 8) of the layer 110 and a surface 102a (labeled in FIG. 8) of the substrate 102 (substrate layer) can be exposed to serve as epitaxial growth seed surfaces.

Figure 7:
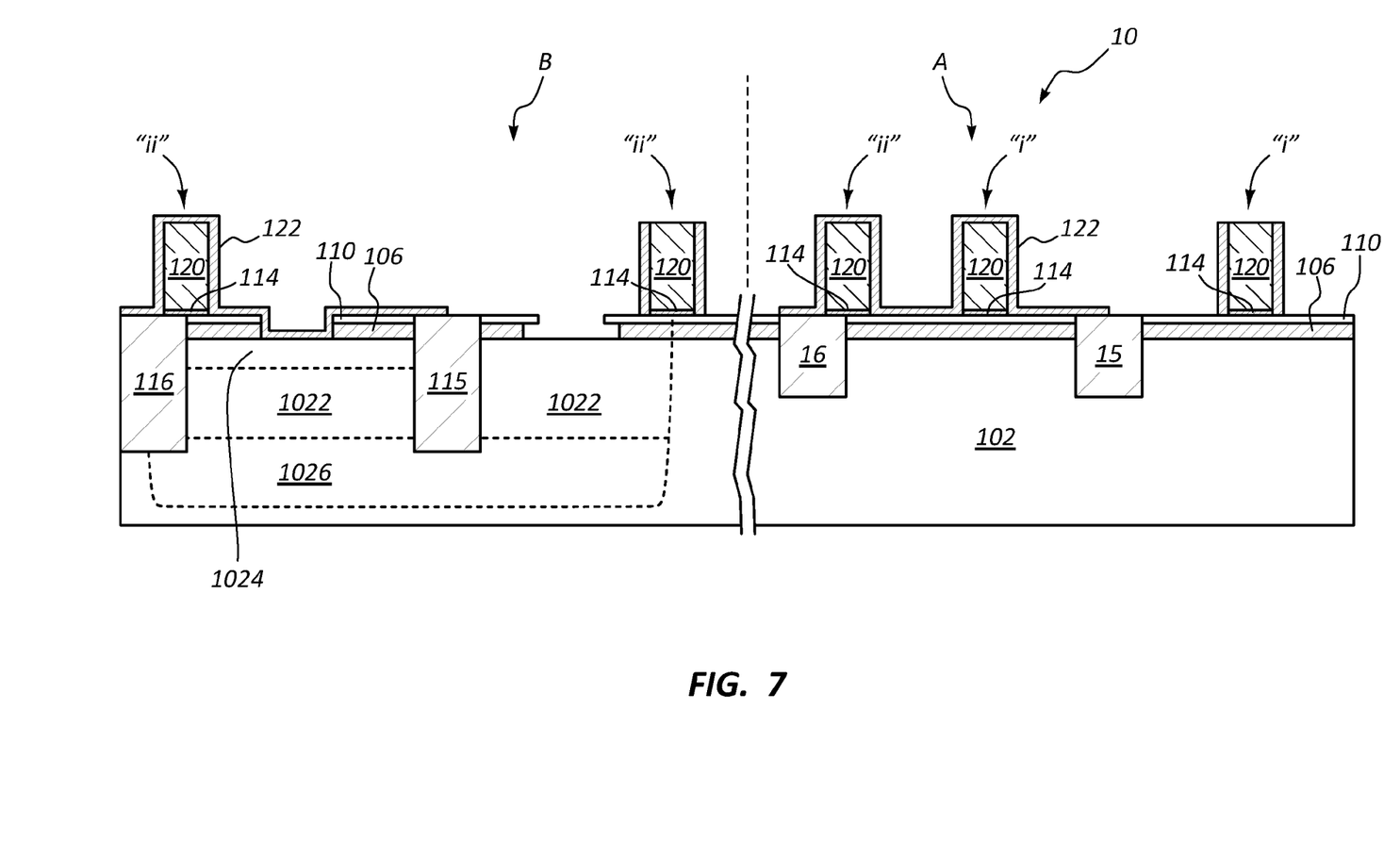
FIG. 7 is a cutaway side view of a semiconductor structure in an intermediary fabrication stage after recessing of a dielectric layer to enlarge an area for facilitation of epitaxial growth.

FIG. 7 illustrates the semiconductor structure 10 after lateral recessing of a section of material of layer 106 within analog region B. Lateral recessing of layer 106 can be performed using etching material that is selective to material of layer 106. As will be set forth herein lateral recessing of material of layer 106 within region A can facilitate formation of an epitaxial growth formation of a merged configuration that includes sections grown from first and second seed surfaces that can be grown from first and second different layers.

Figure 8:
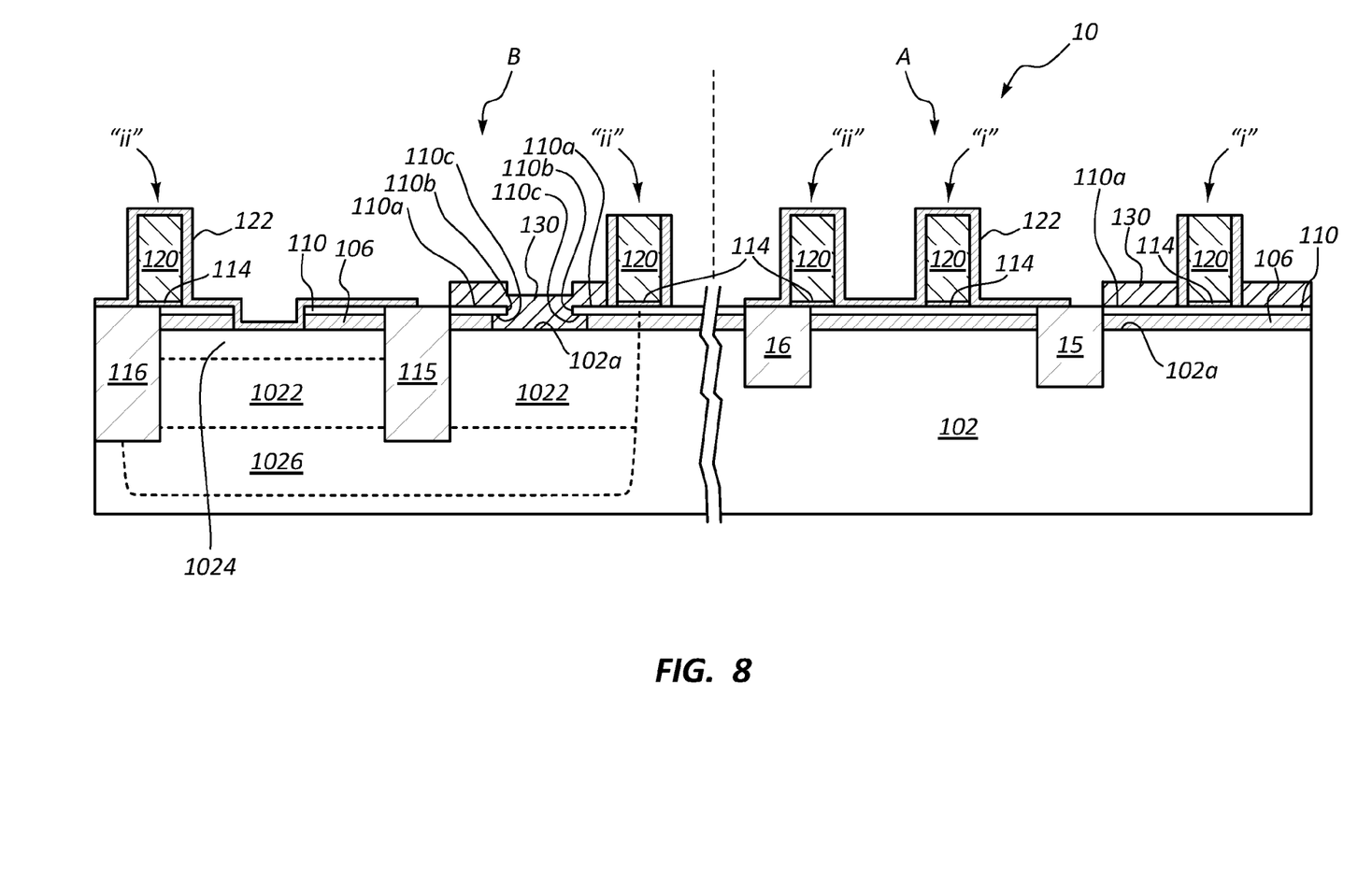
FIG. 8 is a cutaway side view of a semiconductor structure in an intermediary fabrication stage after formation of an epitaxial growth formation.

FIG. 8 illustrates the semiconductor structure 10 as shown in FIG. 7 after formation of an epitaxial growth formation 130 within region A and B. FIG. 8 illustrates an example of block 6 (growing epitaxial growth formation) and block 8 (performing, simultaneous with the growing, epitaxial growth) as set forth in reference to FIG. 1. Within logic region A epitaxially growing (block 6) can include epitaxially growing using a top surface 110a of layer 110 as a seed surface. Within analog region B performing epitaxial growth (block 8) can include using one or more of a top surface 110a a side surface 110b or a bottom surface 110c of layer 110 as seed surfaces for the performing epitaxial growth. Simultaneous with the using one or more of a top surface 110a a side surface 110b or a bottom surface 110c of layer 110 as seed surfaces, the performing epitaxial growth at block 8 can include using a top surface 102a of substrate 102 (substrate layer) as a seed surface for the performing epitaxial growth. Seed surfaces for the performing epitaxial growth at block 8 can include spaced apart surfaces that are opposing surfaces, namely surface 110c and surface 102a (the sections of surface 102a aligned under sections of surface 110c). While a method can be performed without lateral recessing of layer 106 as set forth in FIG. 7, the presence of opposing surfaces 110c and 102a as seed surfaces for the performing epitaxial growth at block 8 can facilitate a formation of an epitaxial growth formation 130 within region B of unitary construction having a merged configuration with sections grown from different surfaces. The different surfaces can include surfaces of different and spaced apart layers 110 and 102. The different surfaces can include opposing surfaces 110c and 102a.

Referring to FIG. 8 epitaxial growth formation 130 within logic region A can define a source-drain of an active MOSFET as shown. Referring to FIG. 8 epitaxial growth formation 130 within analog region B can define an electrode of an analog device. In one embodiment, epitaxial growth formation 130 in region A and region B can include p type material and in region B can define an p electrode of a pn junction that includes an n electrode defined by section 1022 (where section 1022 is an n well section). In one embodiment, epitaxial growth formation 130 can define an electrode of a bipolar junction transistor (BJT). Epitaxial growth formation 130 within analog region A and epitaxial growth formation 130 within analog region B can be simultaneously formed at block 6 and 8 (FIG. 1) during a common epitaxial growth formation process.

Figure 9:
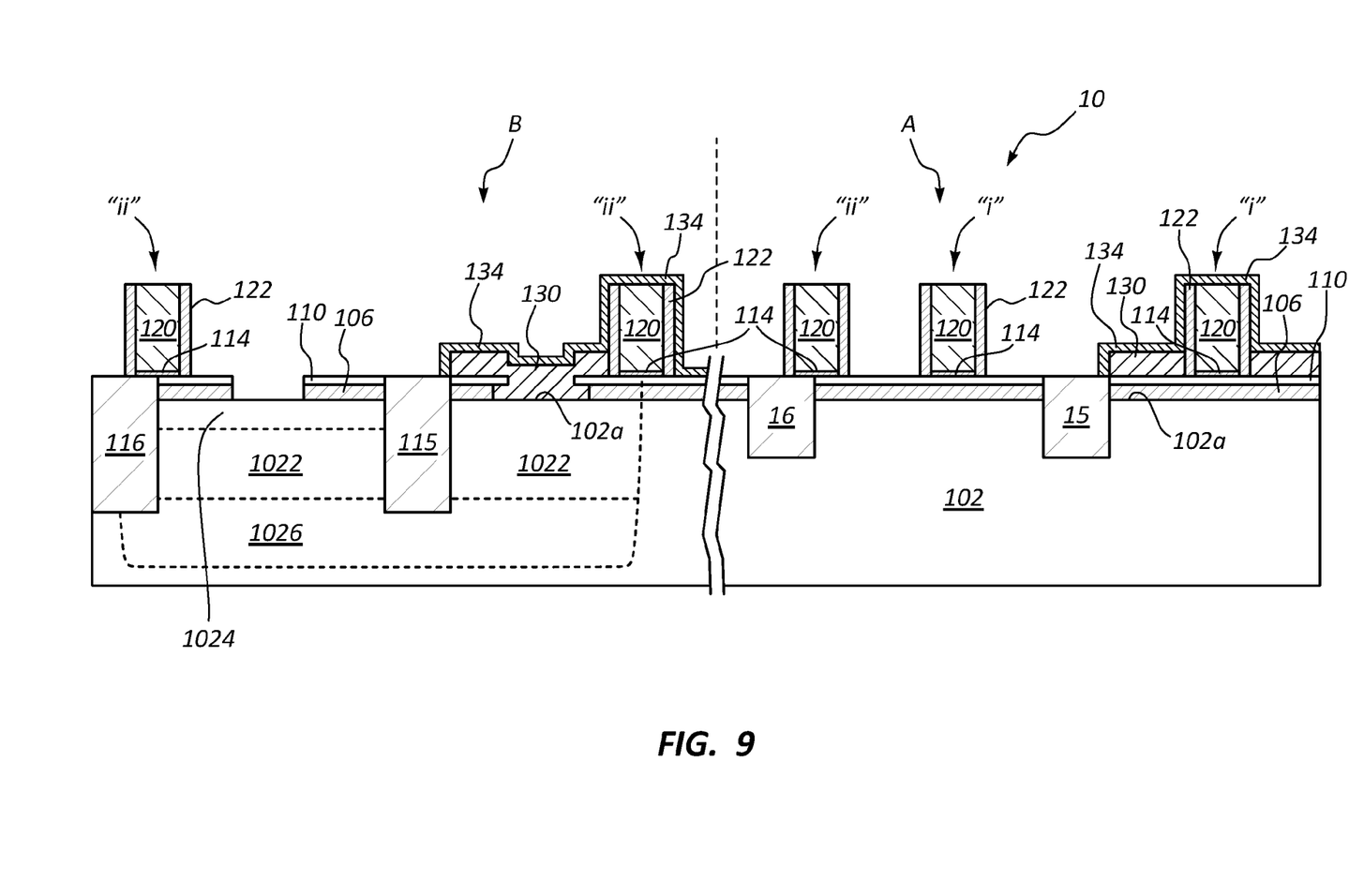
FIG. 9 is a cutaway side view of a semiconductor structure in an intermediary fabrication stage after formation of a dielectric layer for protection of epitaxial growth formations.
Figure 10:
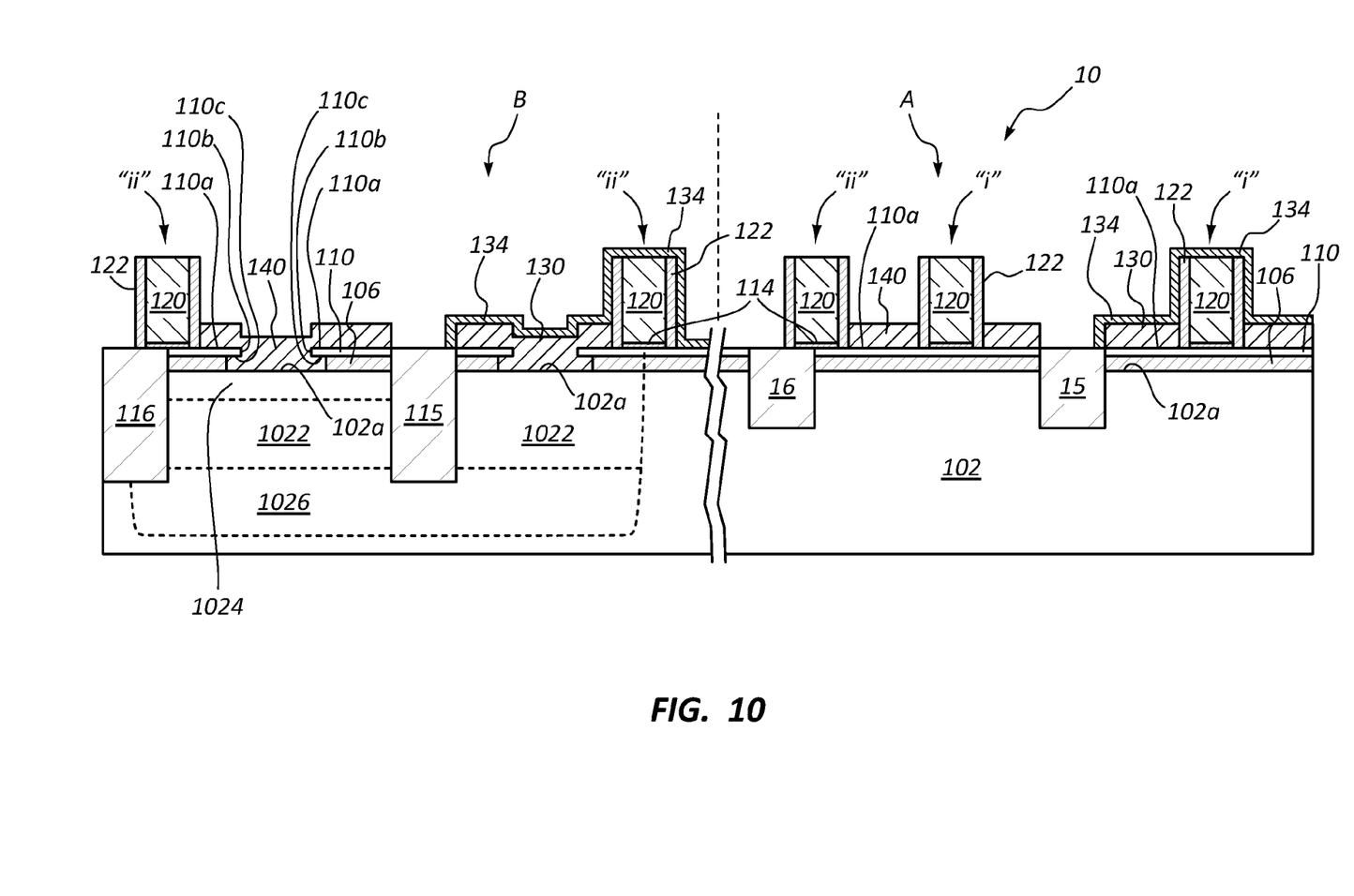
FIG. 10 is a cutaway side view of a semiconductor structure in an intermediary fabrication stage after formation of an epitaxial growth formation.

FIG. 9 illustrates the semiconductor structure 10 as shown in FIG. 8 after removal of a section of material of layer 122 from region B and after formation of layer 134 over formation 130. Layer 134 in one embodiment can be formed of dielectric material, e.g. a low-k dielectric material. FIG. 10 illustrates the semiconductor structure 10 as shown in FIG. 9 after lateral recessing of material of above layer 106, above n+ section 1024 of substrate 102, and after formation of epitaxial growth formation 140 within logic region A and analog region B.

FIG. 10 illustrates the semiconductor structure 10 as shown in FIG. 9 after formation of an epitaxial growth formation 140 within region A and B. FIG. 10 illustrates an example of block 6 (growing epitaxial growth formation) and block 8 (performing, simultaneous with the growing, epitaxial growth) as set forth in reference to FIG. 1. Within logic region A epitaxially growing (block 6) can include epitaxially growing using a top surface 110a of layer 110 as a seed surface. Within analog region B performing epitaxial growth (block 8) can include using one or more of a top surface 110a a side surface 110b or a bottom surface 110c of layer 110 as seed surfaces for the performing epitaxial growth. Simultaneous with the using one or more of a top surface 110a a side surface 110b or a bottom surface 110c of layer 110 as seed surfaces, the performing epitaxial growth at block 8 can include using a top surface 102a of substrate 102 (substrate layer) as a seed surface for the performing epitaxial growth. Seed surfaces for the performing epitaxial growth at block 8 can include spaced apart surfaces that are opposing surfaces, namely surface 110c and surface 102a (the sections at surface 102a that are aligned under sections of surface 110c. While a method can be performed without lateral recessing of layer 106 as set forth in FIG. 10, the presence of opposing surfaces 110c and 102a as seed surfaces for the performing epitaxial growth at block 8 can facilitate a formation of an epitaxial growth formation 140 within region B of unitary construction having a merged configuration with sections grown from different surfaces. The different surfaces can include surfaces of different and spaced apart layers 110 and 102. The different surfaces can include opposing surfaces 110c and 102a (sections of surface 102a that are aligned under sections of surface 110c can be regarded as opposing such sections of surface 110c).

Referring to FIG. 10 epitaxial growth formation 140 within logic region A can define a source-drain of an active MOSFET as shown. Referring to FIG. 10 epitaxial growth formation 140 within analog region B can define an electrode of an analog device. In one embodiment, epitaxial growth formation 140 can include n type material and can define an n electrode of an np junction that includes p electrode defined by p well 1022 adjacent to an electrode defined by n+ section 1024 and formation 140. In one embodiment, formation 140 can define an electrode of a bipolar junction transistor (BJT). Epitaxial growth formation 140 within analog region A and epitaxial growth formation 140 within analog region B can be simultaneously formed during a common epitaxially growth formation process.

Figure 11:
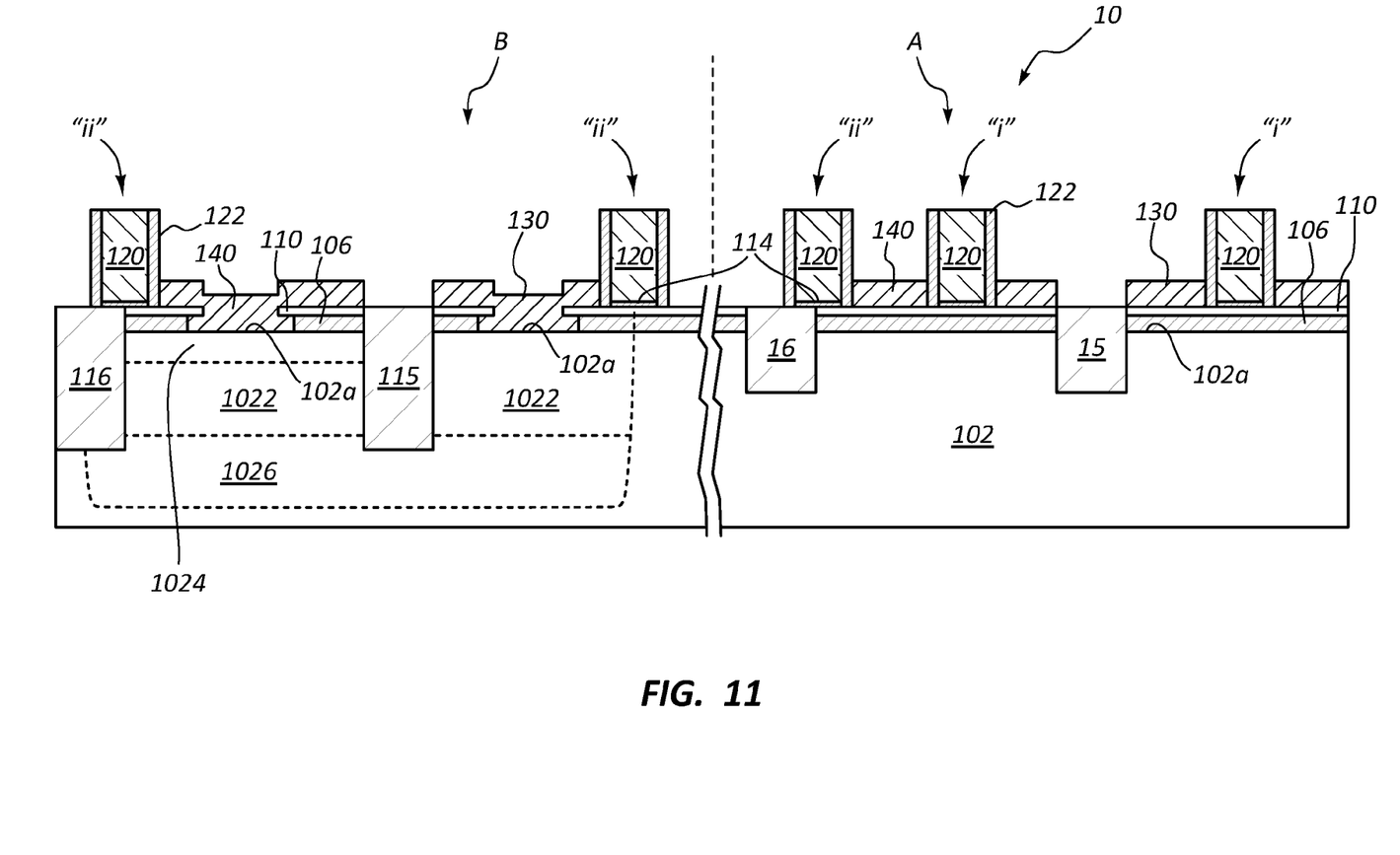
FIG. 11 is a cutaway side view of a semiconductor structure in an intermediary fabrication stage after formation of a dielectric layer.
Figure 12:
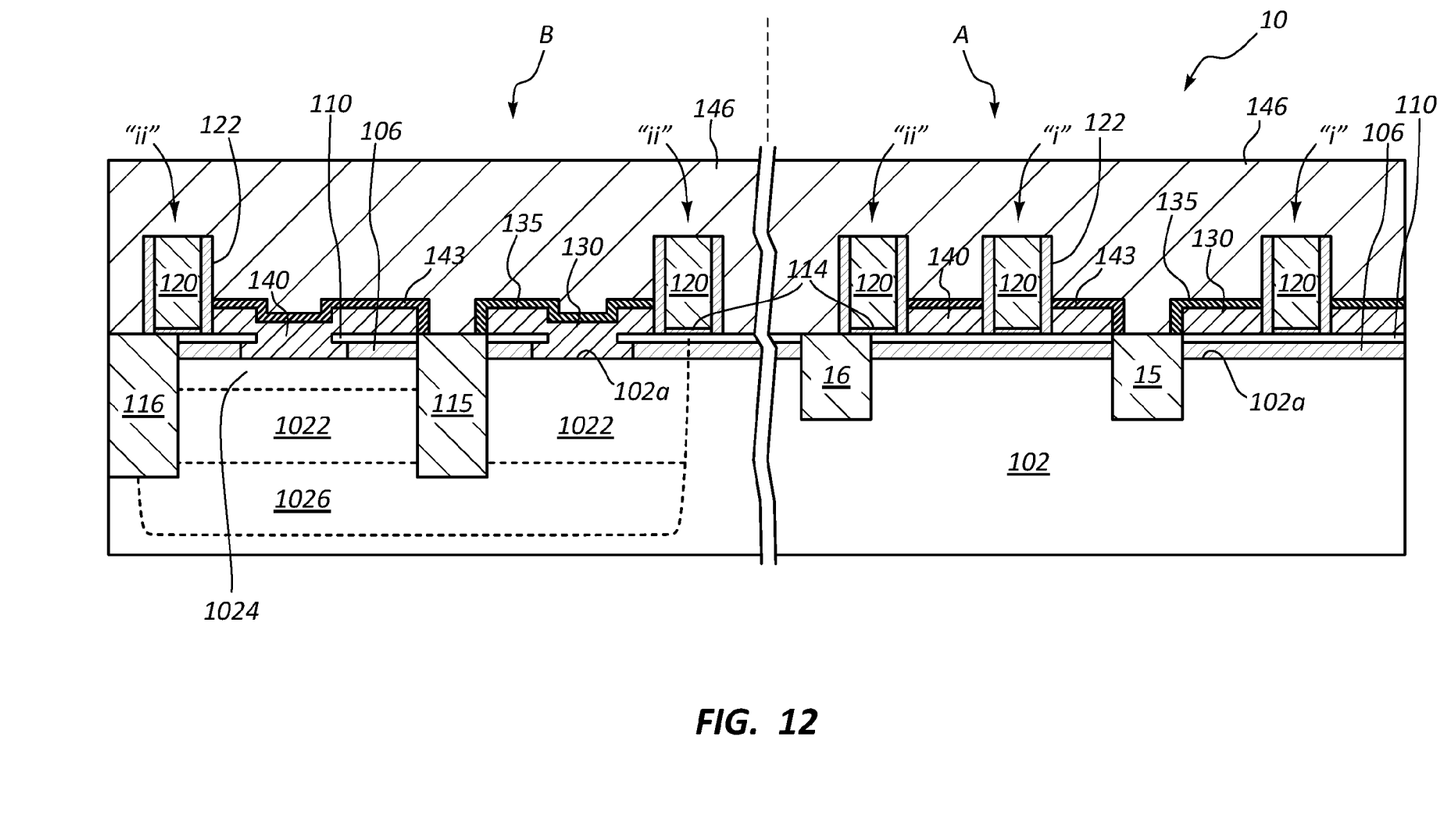
FIG. 12 is a cutaway side view of a semiconductor structure in an intermediary fabrication stage after formation of a dielectric layer.

FIG. 11 illustrates the semiconductor structure 10 as shown in FIG. 10 after removal of layer 134. FIG. 12 illustrates the semiconductor structure 10 as shown in FIG. 11 after formation of layer 143 and layer 146. Layer 143 can be silicide layer formed by silicidation. Layer 146 can be a dielectric layer, e.g., oxide layer.

Figure 13:
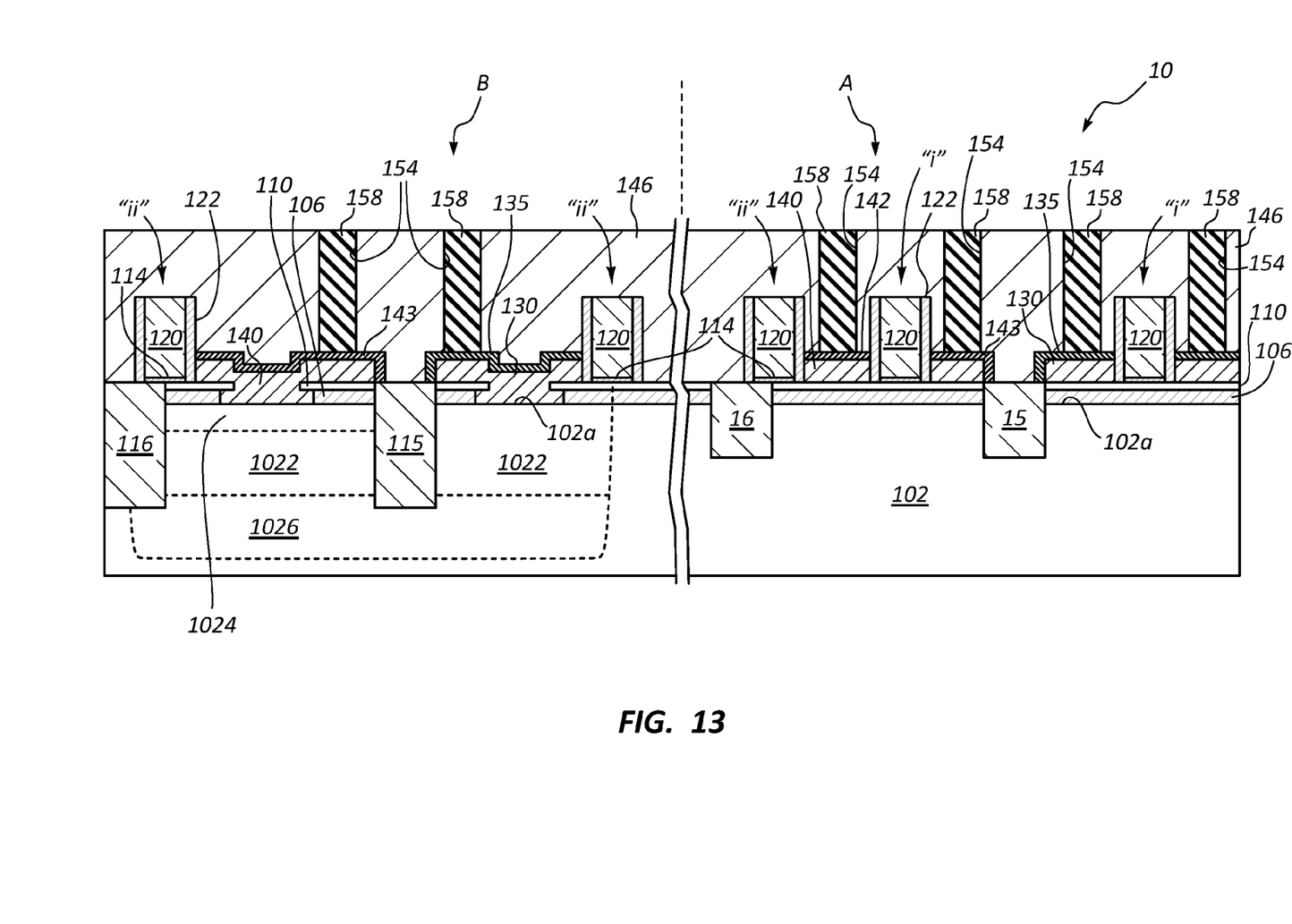
FIG. 13 is a cutaway side view of a semiconductor structure in an intermediary fabrication stage after formation of a contact layer.

FIG. 13 illustrates the semiconductor structure 10 as shown in FIG. 12 after removal of material of layer 110 to define holes 154 which can expose layer 143. Holes 154 can be filled with conductive contact formations 158 for completion of contacts. Conductive contact formations 158 can be formed e.g. of tungsten, copper, aluminum or silver. The method as set for in FIG. 1 can provide for conductive contact formations 158 within each of logic region A and analog region B having substantially common bottom elevations. The method of FIG. 1 can use a single epitaxial growth process in which an epitaxial growth formation 130 defining a source-drain of active MOSFETs within logic region A and an epitaxial growth formation 130 defining an electrode of a bipolar device within analog region B can be simultaneously formed. The method of FIG. 1 can use a single epitaxial growth process in which an epitaxial growth formation 140 defining a source-drain of active MOSFETs within logic region A and an epitaxial growth formation 140 defining an electrode of a bipolar device within analog region B can be simultaneously formed.

Referring to semiconductor structure 10 as set forth in FIGS. 8 and 10 there is illustrated a method of fabricating a semiconductor structure, the method including growing epitaxially growth material to form an epitaxial growth formation that defines an active metal oxide semiconductor field effect transistor (MOSFET) within a logic region of a semiconductor structure, and performing, simultaneously with the growing, epitaxial growth to form an epitaxial growth formation that defines an analog device within an analog region of the semiconductor structure. The epitaxial growth formation of the logic region A can define an active metal oxide semiconductor field effect transistor (MOSFET) by defining a source-drain of an active MOSFET as set forth herein. The epitaxial growth formation of the analog region B can define an analog device by defining an electrode of an analog device as set forth herein.

Referring to semiconductor structure 10 as set forth in FIGS. 8 and 10 there is illustrated performing epitaxial growth to form an epitaxial growth formation that defines an electrode of an analog device within an analog region of the semiconductor structure, wherein the performing includes using a first surface and a second surface as seed surfaces, and wherein the first surface and the second surface are opposing surfaces. In one embodiment the first surface and the second surface can be provided on different layers 110 and 102. In one embodiment the first surface can be provided on a top surface 110a of layer 110 and the second surface can be provided by a bottom surface 110c of the layer 110. In one embodiment the semiconductor structure 10 can be formed using a silicon on insulator (SOI) structure having layers 102, 106, and 110. In one embodiment the epitaxial growth formation 130 and 140 has a top elevation higher that a top elevation of the SOI structure having layer 110 as a top layer. In the embodiments set forth herein, analog region A shown in FIGS. 7 and 9 can have sections of substrate 102 exposed during a fabrication stage for facilitation of an epitaxial growth formation 130 or 140. In one embodiment layer 110 within logic region A can remain in its entirety so that layer 110 convers an entirety of substrate 102 within region A during each formation stage as described in reference to FIGS. 2-13 and further so that region A is absent an exposed section of layer 110 during the fabrication process depicted in FIGS. 2-13.

Each of the formed layers as set forth herein, e.g., layer 102, layer 106, layer 110, layer 112, layer 120, layer 122, layer 134, layer 142, and/or layer 146 can be formed by way of deposition using any of a variety of deposition processes, including, for example, physical vapor deposition (PVD), atomic layer deposition (ALD), chemical vapor deposition (CVD), sputtering, or other known processes, depending on the material composition of the layer. One or more layer of layer 102, layer 106, layer 110, layer 112, layer 120, layer 122, layer 134, layer 142, and/or layer 146 can alternatively be formed by way of a material growth process, e.g. a thermal growth process.

In one example, a protective mask layer as set forth herein, e.g., a mask layers for patterning layer 102, layer 106, layer 110, layer 112, layer 120, layer 122, layer 134, layer 142, and/or layer 146 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 102, layer 106, layer 110, layer 112, layer 120, layer 122, layer 134, layer 142, and/or layer 146 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed. It will be understood that embodiments described as having a certain number of elements can be practiced with less than or greater than the certain number of elements. The term "defines" encompass relationships where an element is partially defined as well as relationships where an element is entirely defined.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a semiconductor structure, the method comprising:
    growing epitaxial growth material to form an epitaxial growth formation that defines an active logic device within a logic region of a semiconductor structure;
    performing, simultaneously with the growing, epitaxial growth to form an epitaxial growth formation that defines an analog device within an analog region of the semiconductor structure.

2. The method of claim 1, wherein the active logic device is provided by a MOSFET.

3. The method of claim 1, wherein the analog device is provided by a bipolar device selected from the group consisting of a pn junction, an np junction of a bipolar junction transistor (BJT).

4. The method of claim 1, wherein the logic device is a transistor that has a channel defined by a thin silicon layer of a silicon on insulator (SOI) structure.

5. The method of claim 1, wherein the analog device is a bipolar device that has an electrode defined by a substrate of a silicon on insulator (SOI) structure.

6. The method of claim 1, wherein the performing is provided using opposing surfaces as seed surfaces.

7. The method of claim 1, wherein the epitaxial growth formation within a logic region defines a source-drain of an active MOSFET, and wherein the epitaxial growth formation within an analog region defines an electrode of an analog device.

8. The method of claim 1, wherein the performing is provided using a top and bottom surface of a layer as seed surfaces.

9. The method of claim 1, wherein the growing is provided using a top surface of a layer as a seed surface and wherein the performing is provided using a top and bottom surface of the layer as a seed surface.

10. The method of claim 1, wherein the growing is provided using a top surface of a layer and wherein the performing is provided using top and bottom surfaces of the layer, and further simultaneously using a surface of a second layer as a seed surface.

11. The method of claim 1, wherein the method includes prior to the performing removing material of a thin silicon layer and a dielectric layer of a silicon on insulator (SOI) structure.

12. The method of claim 1, wherein the method includes prior to the performing, laterally recessing material of a dielectric layer of a silicon on insulator (SOI) structure.

13. A method of fabricating a semiconductor structure, the method comprising:
    performing epitaxial growth to form an epitaxial growth formation that defines an electrode of an analog device within an analog region of the semiconductor structure, wherein the performing includes using a first surface and a second surface as seed surfaces.

14. The method of claim 13, wherein the first surface and the second surface are opposing surfaces.

15. The method of claim 13, wherein the first surface and the second surface are provided on different layers.

16. The method of claim 13, wherein the first surface is provided on a top surface of a layer and wherein the second surface is provided by a bottom surface of the layer.

17. The method of claim 13, wherein the semiconductor structure is formed using a silicon on insulator (SOI) structure, and wherein the epitaxial growth formation has a top elevation higher that a top elevation of the SOI structure.

18. A semiconductor structure comprising:
    a substrate;
    a dielectric layer formed on the substrate;
    a layer formed on the dielectric layer, wherein each of the substrate, the dielectric layer and the layer extend between a logic region and an analog region, wherein within the logic region a surface of the layer is exposed to serve as an epitaxial growth seed surface, and wherein within the analog region a surface of the layer and a surface of the substrate are exposed to serve as epitaxial growth seed surfaces.

19. The semiconductor structure of claim 18, wherein the dielectric layer is laterally recessed in an area of the analog region where the substrate is exposed so that a bottom surface of the layer is exposed to serve an epitaxial growth seed surface.

20. The semiconductor structure of claim 18, including an epitaxial growth formation that extends between exposed surfaces of the layer and the substrate.

* * * * *